US010256775B2

(12) United States Patent
Seshita et al.

(10) Patent No.: US 10,256,775 B2
(45) Date of Patent: Apr. 9, 2019

(54) SEMICONDUCTOR DEVICE INCLUDING AN ESD PROTECTIVE ELEMENT

(71) Applicant: KABUSHIKI KAISHA TOSHIBA, Tokyo (JP)

(72) Inventors: Toshiki Seshita, Kawasaki Kanagawa (JP); Yasuhiko Kuriyama, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/688,632

(22) Filed: Aug. 28, 2017

(65) Prior Publication Data

US 2018/0342988 A1 Nov. 29, 2018

(30) Foreign Application Priority Data

May 25, 2017 (JP) .................. 2017-103704

(51) Int. Cl.
| | |
|---|---|
| H03F 1/52 | (2006.01) |
| H01L 27/12 | (2006.01) |
| H01L 27/02 | (2006.01) |
| H03F 1/22 | (2006.01) |
| H03F 1/02 | (2006.01) |
| H03F 3/195 | (2006.01) |

(52) U.S. Cl.
CPC ......... *H03F 1/523* (2013.01); *H01L 27/0255* (2013.01); *H01L 27/1203* (2013.01); *H03F 1/0205* (2013.01); *H03F 1/223* (2013.01); *H03F 3/195* (2013.01); *H03F 2200/231* (2013.01); *H03F 2200/294* (2013.01); *H03F 2200/414* (2013.01); *H03F 2200/444* (2013.01); *H03F 2200/451* (2013.01)

(58) Field of Classification Search
CPC . H03F 1/22; H03F 1/223; H03F 1/226; H03F 1/52; H03F 1/523
USPC .................................................. 330/298, 311
See application file for complete search history.

(56) References Cited

U.S. PATENT DOCUMENTS 5,300,897 A 4/1994 Shiga
6,665,159 B2 12/2003 Takikawa et al.
(Continued)

FOREIGN PATENT DOCUMENTS

JP H05129856 A 5/1993
JP H10084300 A 3/1998
(Continued)

*Primary Examiner* — Steven J Mottola
(74) *Attorney, Agent, or Firm* — Kim & Stewart LLP

(57) ABSTRACT

A semiconductor device formed on a silicon on insulator substrate includes an input node to receive a first signal, such as a high frequency signal, and an output node to output a second signal corresponding to the first signal. A first transistor has a gate that receives the first signal from the input node and thereby outputs an amplified first signal. A second transistor is connected between a drain of the first transistor and the output node. An inductor is connected between a source of the first transistor and a ground potential. A capacitor connected is between the gate of the first transistor and the input node. An electrostatic discharge (ESD) protective element is connected between a first node and a second node. The first node is between the inductor and the first transistor, and the second node is between the input node and the capacitor.

19 Claims, 7 Drawing Sheets

(56) References Cited

U.S. PATENT DOCUMENTS

| | | | |
|---|---|---|---|
| 7,202,749 B2* | 4/2007 | Mohammadi | H03F 1/223 |
| | | | 330/298 |
| 8,244,199 B2 | 8/2012 | Goto et al. | |
| 9,154,356 B2 | 10/2015 | Tasic et al. | |
| 2011/0221519 A1 | 9/2011 | Katoh et al. | |
| 2014/0268447 A1* | 9/2014 | Gudem | H01L 27/0255 |
| | | | 361/56 |
| 2016/0268978 A1 | 9/2016 | Matsuno | |
| 2016/0301369 A1* | 10/2016 | Heaney | H03F 3/195 |

FOREIGN PATENT DOCUMENTS

| | | |
|---|---|---|
| JP | H10215122 A | 8/1998 |
| JP | 2001110993 A | 4/2001 |
| JP | 4037029 B2 | 1/2008 |
| JP | 2010010728 A | 1/2010 |
| JP | 2011193191 A | 9/2011 |
| JP | 5237842 B2 | 7/2013 |
| JP | 5405283 B2 | 2/2014 |
| JP | 2015517782 A | 6/2015 |
| JP | 2016171163 A | 9/2016 |

* cited by examiner

SEMICONDUCTOR DEVICE INCLUDING AN ESD PROTECTIVE ELEMENT

CROSS-REFERENCE TO RELATED APPLICATION

This application is based upon and claims the benefit of priority from Japanese Patent Application No. 2017-103704, filed May 25, 2017, the entire contents of which are incorporated herein by reference.

FIELD

Embodiments described herein relate generally to semiconductor devices.

BACKGROUND

Changing the manufacturing process of a high-frequency low-noise amplifier (LNA) from a SiGe bipolar process) to a Silicon-On-Insulator (SOI) CMOS process has been studied. The cost of a SOI CMOS process is typically lower than the cost of a SiGe bipolar process, and also, the power loss of a high-frequency signal is reduced with a SOI CMOS process since the parasitic capacitance of a MOS transistor in a SOI CMOS process is smaller. Therefore, a high-frequency switch and a high-frequency LNA can be formed on the same SOI substrate and configured as one chip in a SOI CMOS process by using the SOI process without degradation in electrical characteristics.

To protect such an LNA from electrostatic discharge (ESD), an ESD protective element is sometimes provided at an input terminal of the LNA. However, since the ESD protective element itself has parasitic capacitance, the signal reflection characteristics or noise figure (NF) characteristics of a high-frequency signal at the input terminal are degraded.

DETAILED DESCRIPTION

In general, according to one embodiment, a semiconductor device formed on a silicon on insulator substrate, comprises: an input node to receive a first signal, such as a high-frequency signal, and an output node to output a second signal corresponding to the first signal. A first transistor having a gate receives the first signal from the input node and thereby outputs an amplified first signal. A second transistor is connected between a drain of the first transistor and the output node. A first inductor is connected between a source of the first transistor and a ground potential node. A first capacitor is connected between the gate of the first transistor and the input node. An electrostatic discharge (ESD) protective element is connected between a first node and a second node. Here, the first node is between the first inductor and the first transistor, and the second node is between the input node and the first capacitor.

Hereinafter, embodiments will be described with reference to the drawings. The embodiments are not limited to the following description.

First Embodiment

Figure 1:
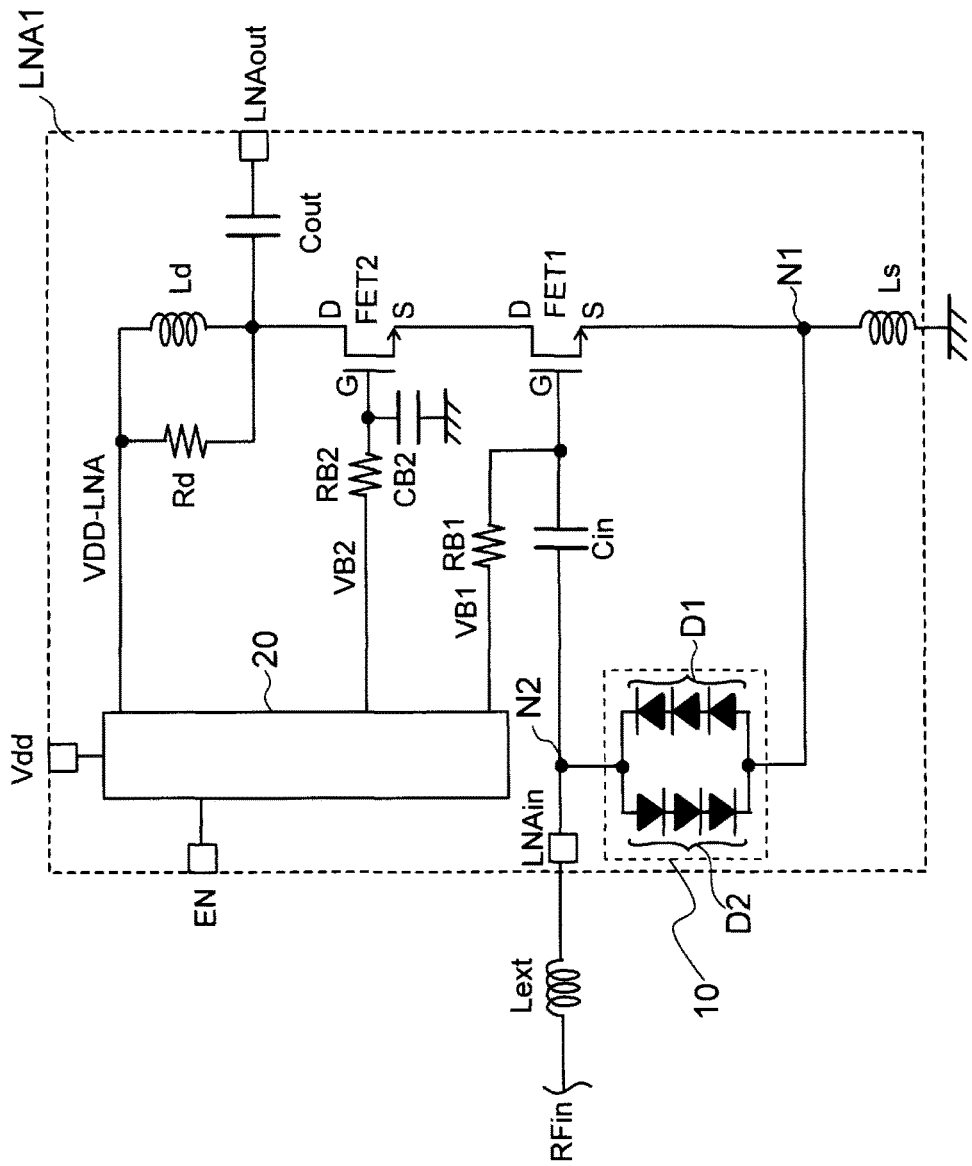
FIG. 1 is a diagram depicting a high-frequency low-noise amplifier (LNA) according to a first embodiment.

FIG. 1 is a diagram depicting a high-frequency low-noise amplifier (LNA) according to a first embodiment. A LNA 1 is provided in a receiving circuit of a communication device that sends and receives a high-frequency signal. The LNA 1 is a semiconductor device that amplifies the high-frequency signal and outputs the amplified high-frequency signal. LNA 1 is formed on a SOI substrate by using a SOI process and configured as one semiconductor chip. The communication device may be, for example, a mobile communication terminal, such as a cellular telephone, a smartphone, a wireless tablet, or a wireless router, a wireless base station, or a wireless access point.

The LNA 1 includes an input terminal LNAin, an output terminal LNAout, a first transistor FET1, a second transistor FET2, inductor elements Ls and Ld, capacitor elements Cin, Cout, and CB2, first, second, and third resistance elements Rd, RB1, and RB2, an ESD protective element 10, and a bias circuit 20. The components of LNA 1 are integrated within a single semiconductor device.

The input terminal LNAin receives a high-frequency signal from the outside (for example, an antenna) of the LNA 1. To the input terminal LNAin, an external inductor element Lext is attached for impedance matching on the input side. The output terminal LNAout outputs the high-frequency signal amplified in the LNA 1 to internal circuits of the communication device.

The first transistor FET1 (hereinafter referred to simply as FET1) is connected between a first node N1 and the second transistor FET2, and the source of FET1 is grounded via the inductor element Ls. The FET1 receives, at the gate thereof, the high-frequency signal from the input terminal LNAin and amplifies this high-frequency signal.

The second transistor FET2 (hereinafter referred to simply as FET2) is provided between the drain of FET1 and the output terminal LNAout and is cascode connected to the drain side of FET1. The gate of FET2 is grounded via the capacitor element CB2. That is, FET2 functions as a gate-grounded FET and forms a cascode amplification circuit with FET1.

As described above, the FET1 and the FET2 are connected in series to be cascode connected between the bias circuit 20 and the ground as a ground voltage source, and amplifies the high-frequency signal received at the gate of the FET1 and outputs the amplified high-frequency signal from the output terminal LNAout.

The first inductor element Ls is provided between the source of the FET1 and the ground. The first inductor element Ls functions as an impedance matching circuit with the parasitic capacitance component of the ESD protective element 10.

The first capacitor element Cin is provided between the input terminal LNAin and the gate of the FET1 and cuts off a direct-current component from the input terminal LNAin.

The ESD protective element 10 is provided between the first node N1 and a second node N2. The first node N1 is a connection node between the source of the FET1 and the first inductor element Ls, and the second node N2 is a connection node between the input terminal LNAin and the first capacitor element Cin. The ESD protective element 10 makes the power by ESD escape to the ground so that the LNA 1 is not damaged by the ESD which is input from the input terminal LNAin.

The ESD protective element 10, between the first node N1 and the second node N2, includes a plurality of first diodes D1, which are connected in series in a forward direction from the first node N1 to the second node N2, and a plurality of second diodes D2, which are connected in series in a forward direction from the second node N2 to the first node N1. That is, the ESD protective element 10 includes a plurality of PN junction diodes D1 and D2 which are connected in parallel in opposite (forward/reverse) current directions.

If the ESD is a negative voltage, the first diodes D1 pass a current by the ESD from the ground. If the ESD is a positive voltage, the second diodes D2 pass a current by the ESD to the ground. As a result, the ESD protective element 10 can protect the LNA 1 from ESD events at the input terminal LNAin.

On the other hand, if a voltage applied to the input terminal LNAin does not exceed a forward bias voltage VF for the plurality of first diodes D1 connected in series or a forward voltage VF for the plurality of second diodes D2 connected in series, the ESD protective element 10 passes substantially no current between the first node N1 and the second node N2. Thus, when a high-frequency signal to be amplified by the LNA 1 is input to the input terminal LNAin, the high-frequency signal can be applied to the gate of the FET1.

As described above, the threshold triggering voltage of discharge of the ESD protective element 10 can be controlled by the number of the first diodes D1 and the number of the second diodes D2. That is, the number of the first diodes D1 and the number of the second diodes D2 only have to be set so that the threshold triggering voltage of the ESD protective element 10 is higher than the expected amplitude of the high-frequency signal while being lower than the breakdown voltage of the LNA 1 which might be otherwise observed when an ESD protective element 10 is not provided.

Moreover, when the ESD protective element 10 is not conducting in a direct-current manner, the ESD protective element 10 functions as a capacitor element between the first node N1 and the second node N2 because the first and second diodes D1 and D2 have a parasitic capacitance (junction capacitance). If a parasitic capacitance component of the ESD protective element 10 is Cesd (for example, 50 femtofarads (fF)), the parasitic capacitance component Cesd and the first inductor element Ls can function as an impedance matching circuit. As described above, the ESD protective element 10 can thus also be used to match the input impedance in addition to increasing ESD tolerance.

The external inductor element Lext, the first inductor element Ls, the first capacitor element Cin, and the ESD protective element 10 are passive elements, which can be used for input impedance matching, and are thus set so that an intended input impedance is achieved in conjunction with a given gain and noise of the FET1 and the FET2. The high-frequency characteristics achieved by the addition of the ESD protective element 10 will be described with reference to FIGS. 2A and 2B.

The second capacitor element Cout is connected between the output terminal LNAout and the drain of the FET2. The second inductor element Ld and the first resistance element Rd are connected in parallel between the bias circuit 20 and the FET2. The second capacitor element Cout is provided to cut off a direct-current component from the output terminal OUT. Moreover, the first resistance element Rd, the second inductor element Ld, and the second capacitor element Cout also function as an output impedance matching circuit. Furthermore, the first resistance element Rd is provided for gain adjustment and stabilization (e.g., the prevention of oscillation) and has resistance more than about ten times higher than the absolute value of the impedance of the second inductor element Ld, for example.

The second resistance element RB1 is connected between the gate of the FET1 and the bias circuit 20. The third resistance element RB2 is connected between the gate of the FET2 and the bias circuit 20. The second and third resistance elements RB1 and RB2 are provided to prevent the high-frequency signal from entering the bias circuit 20. Though not specifically depicted in the drawing, in the present embodiment, a capacitor element for impedance matching may be further provided between the gate and the source of the FET1.

The bias circuit 20 applies first and second bias voltages VB1 and VB2 to the gates of the FET1 and FET2, respectively, based on an enable signal EN and applies a power supply voltage VDD_LNA to the drain of the FET2. The bias voltages VB1 and VB2 and the power supply voltage VDD_LNA are generated from an external voltage Vdd. For instance, the bias circuit 20 receives the enable signal EN from an external control device (not depicted in the drawing), and applies the bias voltage VB1 to the gate of the FET1 and applies the bias voltage VB2 to the gate of the FET2 to drive or stop the LNA 1. For example, the control device sets the enable signal EN at a high level in gain mode and the bias circuit 20 sets the bias voltages VB1 and VB2 at a predetermined voltage, which allows the LNA 1 to perform an amplification operation. On the other hand, the control device sets the enable signal EN at a low level in bypass mode or standby mode and the bias circuit 20 sets the bias voltages VB1 and VB2 at almost zero, which causes the LNA 1 to stop an amplification operation.

In gain mode, when a high-frequency signal is input from the input terminal LNAin, the high-frequency signal is applied to the gate of the FET1 via the first capacitor element Cin. Since the bias voltages VB1 and VB2 are respectively applied to the gates of the FET1 and the FET2, the FET1 and the FET2 amplify this high-frequency signal and outputs the amplified high-frequency signal from the output terminal OUT via the second capacitor element Cout.

Figure 2A:
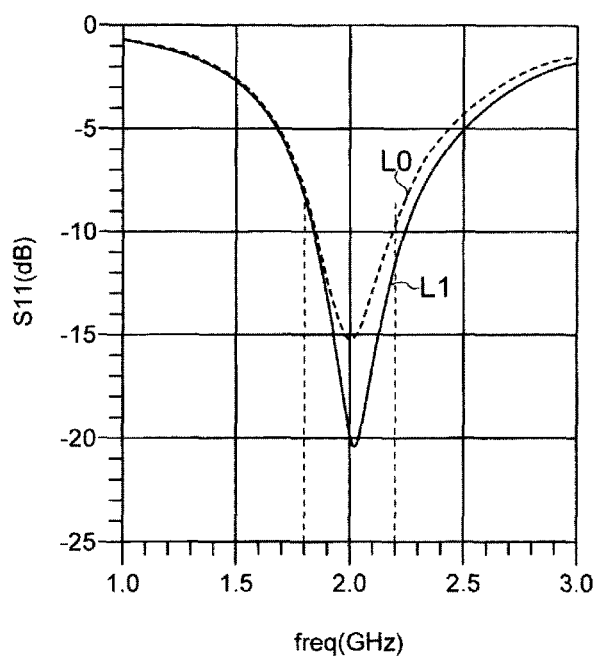
FIGS. 2A and 2B are graphs depicting the high-frequency characteristics of an LNA according to an embodiment in an amplification operation.
Figure 2B:
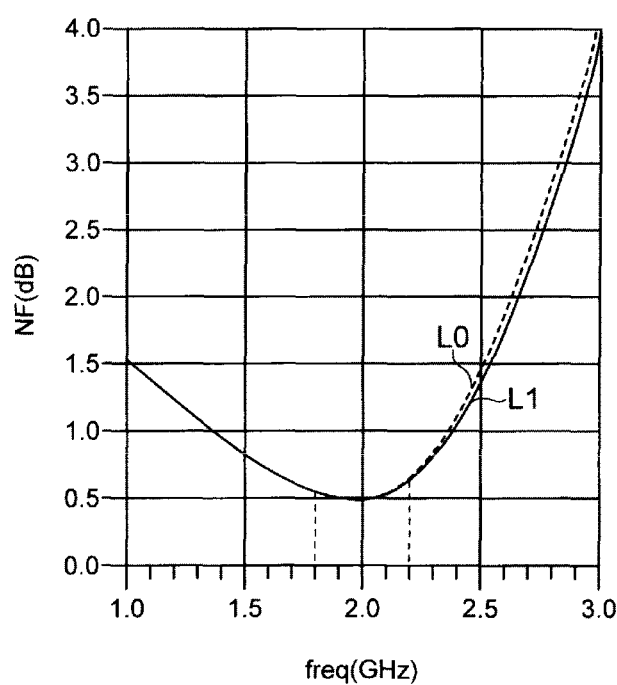

FIGS. 2A and 2B are each a graph depicting the high-frequency characteristics of the LNA 1 in an amplification operation. FIG. 2A depicts the high-frequency characteristics of S11. FIG. 2B depicts the high-frequency characteristics of noise figure (NF). In the present embodiment, it is assumed that the LNA 1 is designed to use 1.8 to 2.2 GHz as a signal frequency band.

S11 is an S parameter related to the reflection characteristics of a high-frequency signal at the input terminal LNAin. Here, the smaller S11, the lower the loss (so-called input return loss) caused by the reflection at the input terminal LNAin.

Figure 3:
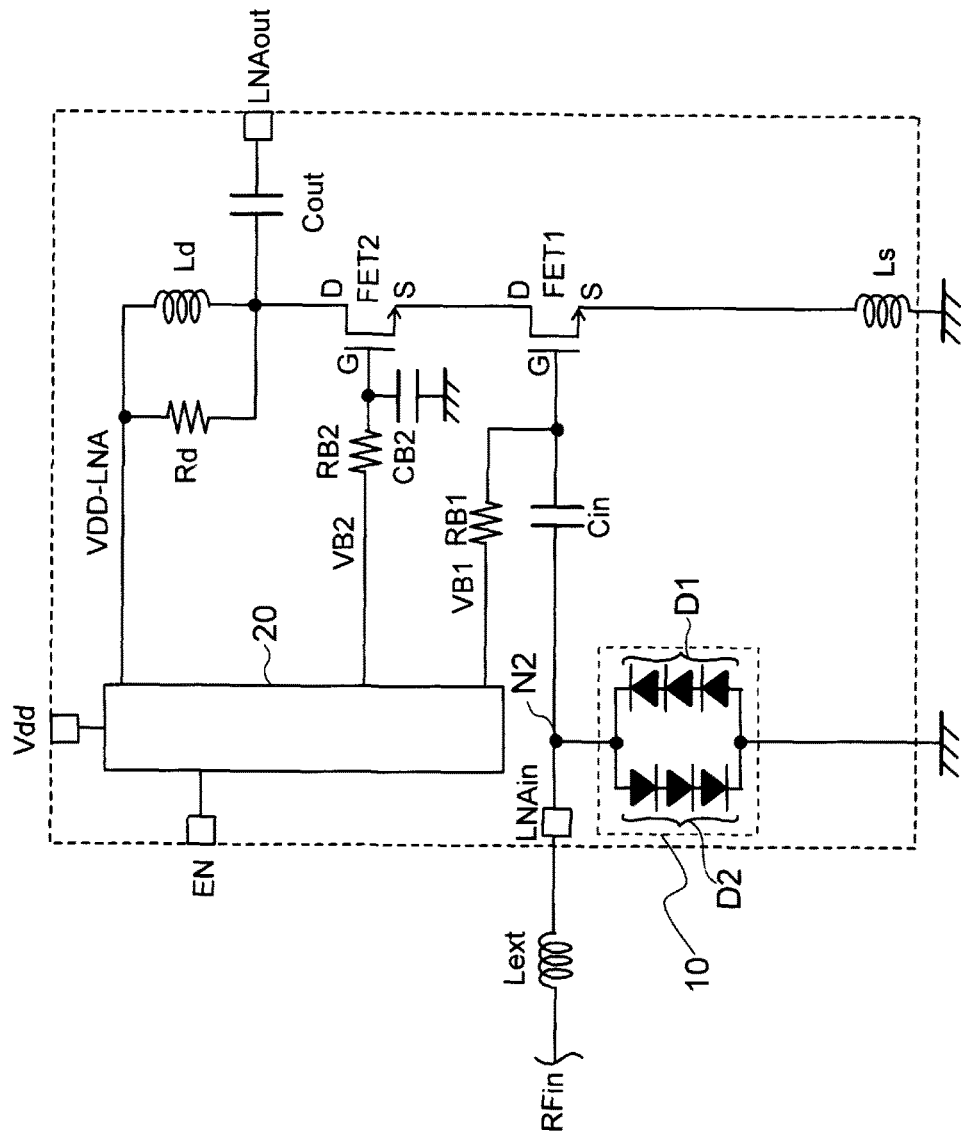
FIG. 3 is a diagram depicting a LNA according to a comparative example.

A solid line L1 indicates the characteristics of the LNA 1 according to the present embodiment, and a dashed line L0 indicates the characteristics of an LNA of a comparative example. FIG. 3 is a diagram depicting the configuration of the LNA according to the comparative example. In the comparative example, an ESD protective element is connected between an input terminal LNAin and a ground. The other constituent elements of the comparative example may be similar to the constituent elements of the first embodiment. Though not specifically depicted in the drawings, it can be confirmed that, the addition of the ESD protective element 10 to the comparative example, causes degradation in S11 and NF. That is, as compared to a comparative example LNA having no ESD protective element 10 at all, there is degradation in the S parameter and the noise figure (NF) for the comparative example due to the inclusion of the ESD protective element 10 in the manner depicted in FIG. 3.

On the other hand, with reference to FIG. 2A, an improvement is observed for S11 in the LNA 1 according to the present embodiment as compared to the comparative example of FIG. 3. That is, the input return loss of a high-frequency signal in the present embodiment is lower than the input return loss in the comparative example of FIG. 3. This is because the ESD protective element 10 is connected between the input terminal LNAin and the source of the FET1 and the parasitic capacitance component of the ESD protective element 10 is used for input impedance matching.

With reference to FIG. 2B, the NF for the LNA 1 according to the present embodiment is almost the same as NF in the comparative example. Therefore, the LNA 1 according to the present embodiment can reduce input return loss without an increase in noise. Similarly, an S parameter (referred to as S22) related to the reflection characteristics of a signal at the output terminal LNAout in the present embodiment is almost the same as the S parameter (S22) in the comparative example. As described above, according to the present embodiment, even when the ESD protective element 10 is added, degradation in the high-frequency characteristics such as an S parameter and noise figure can be prevented.

Moreover, the LNA 1 according to the present embodiment is formed on a SOI substrate by using a SOI process. The cost of a SOI process is generally lower than the cost of a SiGe process and the parasitic capacitance of a MOS transistor formed by the SOI process is typically small, which reduces the power loss of a high-frequency signal. Thus, according to the present embodiment, without degradation in the electrical characteristics, a high-frequency switch and an LNA can be formed on the same SOI substrate and configured as one semiconductor chip.

Second Embodiment

Figure 4:
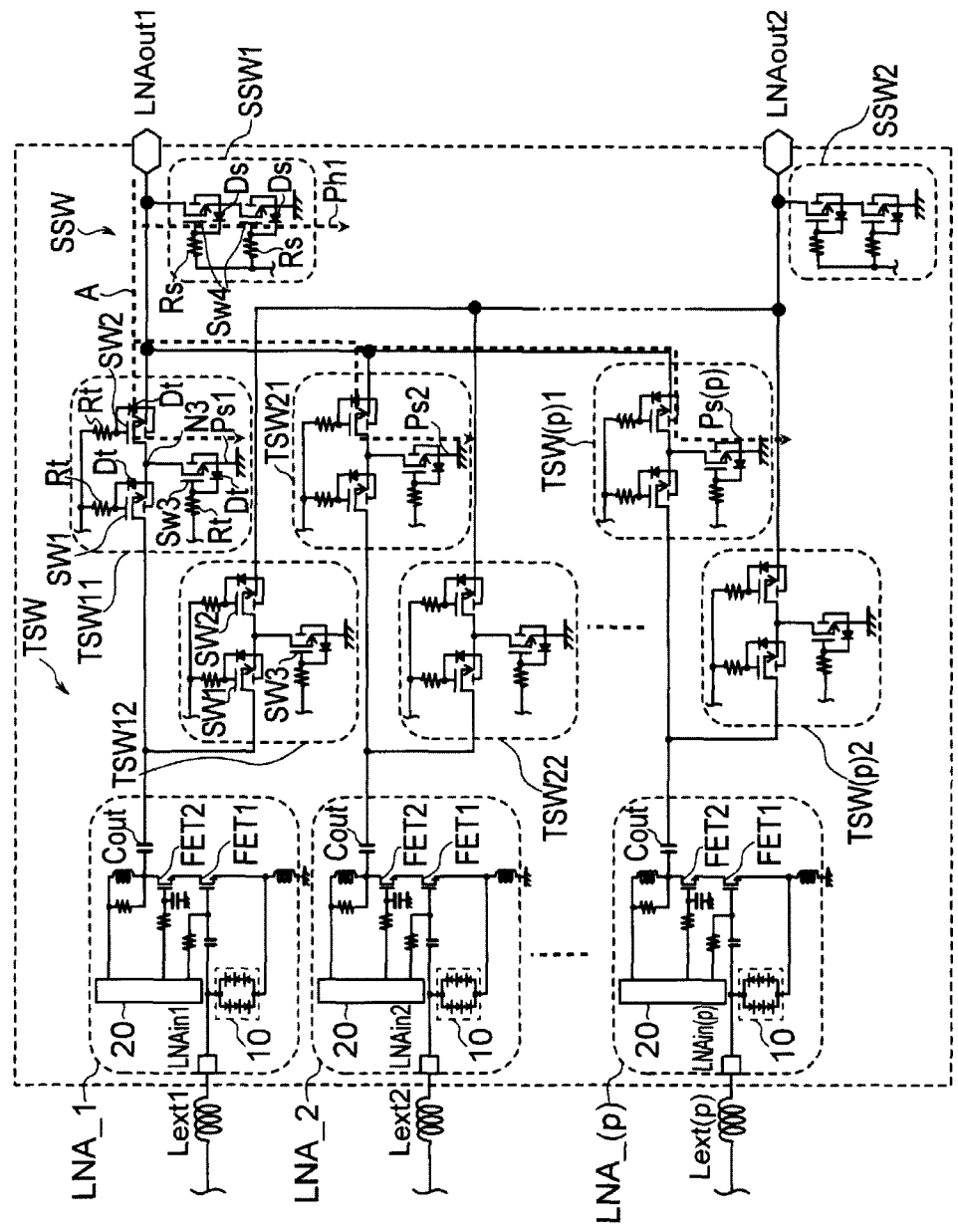
FIG. 4 is a diagram depicting a LNA according to a second embodiment.

FIG. 4 is a diagram depicting a LNA according to a second embodiment. In the first embodiment, just one LNA (LNA 1) is provided on a semiconductor chip. On the other hand, in the second embodiment, a plurality of LNAs: LNA_1 to LNA_(p) are provided on one semiconductor chip so as to correspond to a plurality of inputs (LNAin1 to LNAin(p)). Here, p is an integer greater than or equal to 3. To connect any one of the plurality of LNAs (LNA_1 to LNA_(p)) to one of an output terminal LNAout1 or an output terminal LNAout2, a through-switch circuit group TSW is provided between the plurality of LNAs: LNA_1 to LNA_(p) and the output terminals LNAout1 and LNAout2. Each of the output terminals LNAout1 and LNAout2 is also provided with a shunt switch circuit group SSW. The through-switch circuit group TSW and the shunt switch circuit group SSW are provided on the SOI substrate and configured within one semiconductor chip.

If there are p input terminals (LNAin1 to LNAin (p)) and there can be q output terminals (LNAout1 to LNAout(q)), the through-switch circuit group TSW according to the second embodiment would be a p-Pole q-Throw switch. Such an LNA with a plurality of inputs and a plurality of outputs is needed to implement carrier aggregation to speed up wireless communication. By switching the through-switch circuit group TSW, a high-frequency signal input from any one of the input terminals (any of the p input terminals: LNAin1 to LNAin(p)) can be amplified and output from any one of the output terminal (LNAout1 or LNAout2).

The LNA_1 to LNA_(p) each have a configuration similar to the configuration of the LNA 1 of the first embodiment. Thus, detailed explanations of the internal configuration of the LNA_1 to LNA_(p) will be omitted. However, the through-switch circuit group TSW is interposed between the output terminals LNAout1 and LNAout2 and the LNA_1 to LNA_(p).

The p input terminals LNAin: first to p-th input terminals LNAin1 to LNAin(p) are provided so as to correspond to the LNA_1 to LNA_(p). The q (where q<p) output terminals: first to q-th output terminals LNAout1 to LNAout(q) are also provided. In the present embodiment, two output terminals (LNAout1 and LNAout2) are provided. That is, in this example, q=2.

The through-switch circuit group TSW includes through-switch circuits TSW11 and TSW12 corresponding to the LNA_1, through-switch circuits TSW21 and TSW22 corresponding to the LNA_2, through-switch circuits TSW31 and TSW32 corresponding to the LNA_3 as so forth to the through-switch circuits TSW(p)1 and TSW(p)2 corresponding to the LNA_p. TSW(k)1 and TSW(k)2 are provided so as to correspond to the output terminals LNAout1 and LNAout2. That is, 1≤k≤p. In other words, a pair of through-switch circuits TSW(k)1 and TSW(k)2 corresponding to the output terminals LNAout1 and LNAout2 is provided so as to correspond to each of the LNA_1 to LNA_(p).

Since the through-switch circuits TSW11 to TSW(p)2 have basically the same internal configuration, the internal configuration of the through-switch circuit TSW11 will be explained and explanations of the internal configurations of the other through-switch circuits will be omitted.

The through-switch circuit TSW11 includes first to third switches SW1 to SW3. The first and second switches SW1 and SW2 are connected in series between the output terminal LNAout1 and an FET2 of the LNA_1. A capacitor element Cout is interposed between the first switch SW1 and the FET2.

The third switch SW3 is connected between a third node N3, which is located between the first switch SW1 and the second switch SW2, and a ground. In the second embodiment, only one third switch SW3 is provided. However, a plurality of third switches SW3_1 to SW3_m may be connected in series between the third node N3 and the ground. It is to be noted that here "m" is an integer greater than or equal to 1. In this example, the value of m is related to the number of the fourth switches SW4 used to form a shunt switch circuit and this relationship will be described later.

The internal configuration of the through-switch circuit TSW12 is similar to the internal configuration of the through-switch circuit TSW11. However, the through-switch circuit TSW12 is connected between the LNA_1 and the output terminal LNAout2.

Likewise, the internal configurations of the through-switch circuits TSW(k)1 and TSW(k)2 are similar to the internal configuration of the through-switch circuit TSW11. However, the through-switch circuit TSW(k)1 is connected between an LNA_(k) and the output terminal LNAout1, and the through-switch circuit TSW(k)2 is connected between the LNA_(k) and the output terminal LNAout2.

A resistance element Rt is connected to the gate of each of the first to third switches SW1 to SW3 so that a high-frequency signal does not enter the gate sides of the first to third switches SW1 to SW3. A diode Dt is connected between the gate and the body of each of the first to third switches SW1 to SW3. The gates of the first to third switches SW1 to SW3 are connected to an external controller and the on/off switch state of the first to third switches SW1 to SW3 is controlled by the external controller.

The shunt switch circuit group SSW includes shunt switch circuits SSW1 and SSW2. The shunt switch circuits SSW1 and SSW2 are provided so as to correspond to the output terminals LNAout1 and LNAout2, respectively.

Since the shunt switch circuits SSW1 and SSW2 have basically the same internal configuration, the internal configuration of the shunt switch circuit SSW1 will be explained and explanations of the internal configuration of the shunt switch circuit SSW2 will be omitted.

The shunt switch circuit SSW1 includes m+1 fourth switches SW4. The m+1 fourth switches SW4 are connected in series between the output terminal LNAout1 and the ground. In the second embodiment, since m=1, two of the fourth switches SW4 are connected in series between the output terminal LNAout1 and the ground.

As described above, the internal configuration of the shunt switch circuit SSW2 is similar to the internal configuration of the shunt switch circuit SSW1, but the shunt switch circuit SSW2 is connected between the output terminal LNAout2 and the ground.

A resistance element Rs is connected to the gate of each of the fourth switches SW4 so that a high-frequency signal does not enter the gate sides of the fourth switches SW4. Between the gate and the body of each fourth switch SW4, a diode Ds is connected. The gates of the fourth switches SW4 are connected to an external controller and on/off switching states of fourth switches SW4 are controlled by the external controller.

Here, the relationship between m and the number of the fourth switches SW4 will be described. The number of fourth switches SW4 is set to a number m+1, which is larger than the number of the third switches SW3 by one, in order to make the numbers of switches which are connected in parallel from the output terminal LNAout1 or LNAout2 to the ground in the shunt switch circuit and the through-switch circuit equal to each other. For instance, there are two switches SW2 and SW3 connected in series in the through-switch circuit TSW11 between the output terminal LNAout1 and the ground. Also, in the shunt switch circuit SSW1, there are two switches SW4 connected in series between the output terminal LNAout1 and the ground. Therefore, the number of the fourth switches SW4 is the number m+1 obtained by adding one the number m of third switches SW3. There are also the number m of second switches SW2. As a result, the same number of switches (SW2, SW3) and switches (SW4, SW4) are connected in parallel with each other between the output terminal LNAout1 and the ground.

Moreover, the second to fourth switches SW1 to SW4 are each MOSFETs having characteristics (such as a threshold voltage, a gate length, the thickness of a gate insulating film, and so forth) excepting for gate width are substantially identical to each other so as to bring the switches SW2 and SW3 of the through-switch circuit and the two switches SW4 of the shunt switch circuit into conduction at substantially the same time when a high voltage (e.g., an ESD) is applied to the output terminal LNAout1 or LNAout2. It is to be noted that the first switch SW1 may also be nearly identical to the second to fourth switches SW2 to SW4 in the characteristics (e.g., a threshold voltage, a gate length, the thickness of a gate insulating film, and so forth) excepting for a gate width.

As described above, by making the shunt switch circuits SSW1 and SSW2 and the through-switch circuits TSW11 to TSW(p)2 have the same number of switches from the output terminal LNAout1 or LNAout2 to the ground and having the same characteristics of the switches, the shunt switch circuits SSW1 and SSW2 and the through-switch circuits TSW11 to TSW(p)2 also function as an ESD protective circuit.

For example, if a high voltage from an ESD is applied to the output terminal LNAout1 when the shunt switch circuits SSW1 and SSW2 and the through-switch circuits TSW11 to TSW(p)2 are in an off state, two switches (SW2, SW3) of each of the through-switch circuits TSW11, TSW21, . . . , TSW(p)1 and two switches (SW4, SW4) of the shunt switch circuit SSW1 are brought into conduction at the same time.

As a result, as indicated by a dashed arrow A, a current caused by the ESD flows into the ground via a path Ph1 passing through the shunt switch circuit SSW1 and paths Ps1 to Ps(p) passing through the through-switch circuits TSW11, TSW21, . . . , TSW(p)1. As described above, a current caused by the ESD flows through the paths Ph1 and Ps1 to Ps(p), which are connected in parallel. As a result, the gate width of a switch that functions as an ESD protective element can be substantially increased, which makes a current caused by the ESD flow easily.

For instance, assume that the gate width of each of the first to third switches SW1 to SW3 is about 0.1 mm and the gate width of the fourth switch SW4 is about 0.6 mm. Moreover, in this instance, assume that p=4. In this case, the effective gate width of the switches SW2 to SW4 functioning as an ESD protective element is about 1.0 mm (0.1 mm×4+0.6 mm). This is equivalent to a state in which a single switch having a gate width of about 1.0 mm is provided as an ESD protective element. As a result, an ESD tolerance of 2 kV or more can be achieved according to a Human Body Model for the ESD event. As described above, as a result of the shunt switch circuit SSW1 and the through-switch circuits TSW11 to TSW(p)1 functioning as an ESD protective element, ESD tolerance can be increased without separately providing an ESD protective element.

When a high voltage from the ESD is applied to the output terminal LNAout2, the two switches (SW2, SW3) of each of the through-switch circuits TSW12, TSW22, . . . , TSW(p)2 between the output terminal LNAout2 and the ground and the two switches SW4 of the shunt switch circuit SSW2 are brought into conduction at the same time. As a result, ESD tolerance can be increased without separately providing a dedicated ESD protective element at the output terminal LNAout2.

If an ESD protective element is separately provided for the output terminals LNAout1 and LNAout2, parasitic capacitance of this ESD protective element degrades the high-frequency characteristics of an LNA in a normal amplification operation.

By contrast, in the LNA according to the second embodiment, the through-switch circuit group TSW and the shunt switch circuit group SSW double in function as an ESD protective element. Therefore, ESD tolerance can be increased without providing a separate, dedicated ESD protective element in addition to the through-switch circuit group TSW and the shunt switch circuit group SSW.

Next, an operation of the through-switch circuit group TSW and the shunt switch circuit group SSW in a normal amplification operation will be described.

For example, in order to output the high-frequency signal amplified by the LNA_1 from the output terminal LNAout1, the first and second switches SW1 and SW2 of the through-switch circuit TSW11 are turned on and the third switch SW3 of the through-switch circuit TSW11 and the two fourth switches SW4 of the shunt switch circuit SSW1 are turned off. As a result, the high-frequency signal can be output from the output terminal LNAout1. A state in which the first and second switches SW1 and SW2 are turned on and the third switch SW3 is turned off as described above is also referred to as an "on state of the through-switch circuit". Moreover, a state in which the two fourth switches SW4 are turned off is also referred to as an "off state of the shunt switch circuit".

In the through-switch circuits TSW12 to TSW(p)2 other than the through-switch circuit TSW11, the first and second switches SW1 and SW2 are turned off and the third switch SW3 is turned on. Here, the through-switch circuits TSW11 to TSW(p)2 are so-called T-type switches, each of which is configured with two switches SW1 and SW2 connected in series and a switch SW3 connected between the third node N3, which is located between the two switches SW1 and SW2, and the ground. Therefore, by turning off the first and second switches SW1 and SW2 and turning on the third switch SW3, the third node N3 of the through-switch circuit is electrically disconnected from both the input terminal side (the LNA side) and the output terminal side and is furthermore shunted to the ground. As a result, the isolation characteristics of the LNA and the output terminal are increased. A state in which the first and second switches SW1 and SW2 are turned off and the third switch SW3 is turned on as described above is also referred to as an "off state of the through-switch circuit". Moreover, a state in which the two fourth switches SW4 are turned on is also referred to as an "on state of the shunt switch circuit".

In order to output a high-frequency signal that has been amplified by the LNA_1 from the output terminal LNAout1, the through-switch circuit TSW11 is brought into an on state and all the other through-switch circuits TSW12 to TSW(p)2 are brought into an off state. Also, the shunt switch circuit SSW1 is brought into an off state and the shunt switch circuit SSW2 is brought into an on state. As a result, a high-frequency signal from LNA_1 is output at the output terminal LNAout1 with low loss and signal leakage to LNAout2 can be prevented.

In order to output a high-frequency signal that has been amplified by LNA_1 from the output terminal LNAout2, the through-switch circuit TSW12 is brought into an on state and all the other through-switch circuits TSW11 and TSW21 to TSW(p)2 are brought into an off state. Also, the shunt switch circuit SSW2 is brought into an off state and the shunt switch circuit SSW1 is brought into an on state. As a result, the high-frequency signal from the LNA_1 is output from the output terminal LNAout2 with low loss and signal leakage to LNAout1 can be prevented.

Likewise, more generally, to output the high-frequency signal that has been amplified by the LNA_(k) (1≤k≤p) from the output terminal LNAout1 (or LNAout2), the through-switch circuit TSW(k)1 (or TSW(k)2) corresponding thereto is brought into an on state and all the other through-switch circuits are brought into an off state. Moreover, the shunt switch circuit SSW1 (or SSW2) is brought into an off state and the shunt switch circuit SSW2 (or SSW1) is brought into an on state. As a result, the high-frequency signal from the LNA_(k) is output from the output terminal LNAout1 (or LNAout2) with low loss and signal leakage to the output terminal LNAout2 (or LNAout1) can be prevented.

As described above, in the LNA according to the second embodiment, in addition to the switching function of the high-frequency signal, the through-switch circuit group TSW and the shunt switch circuit group SSW double as an ESD protective element. Therefore, ESD tolerance can be increased without separately providing an ESD protective element in addition to the through-switch circuit group TSW and the shunt switch circuit group SSW. The absence of a separate ESD protective element in this context reduces ground parasitic capacitance, thus gain loss and return loss of the LNA can be prevented.

Moreover, as a result of the through-switch circuits TSW11 to TSW(p)2 being T-type switches, the isolation characteristics in an off state can be increased.

Third Embodiment

Figure 5:
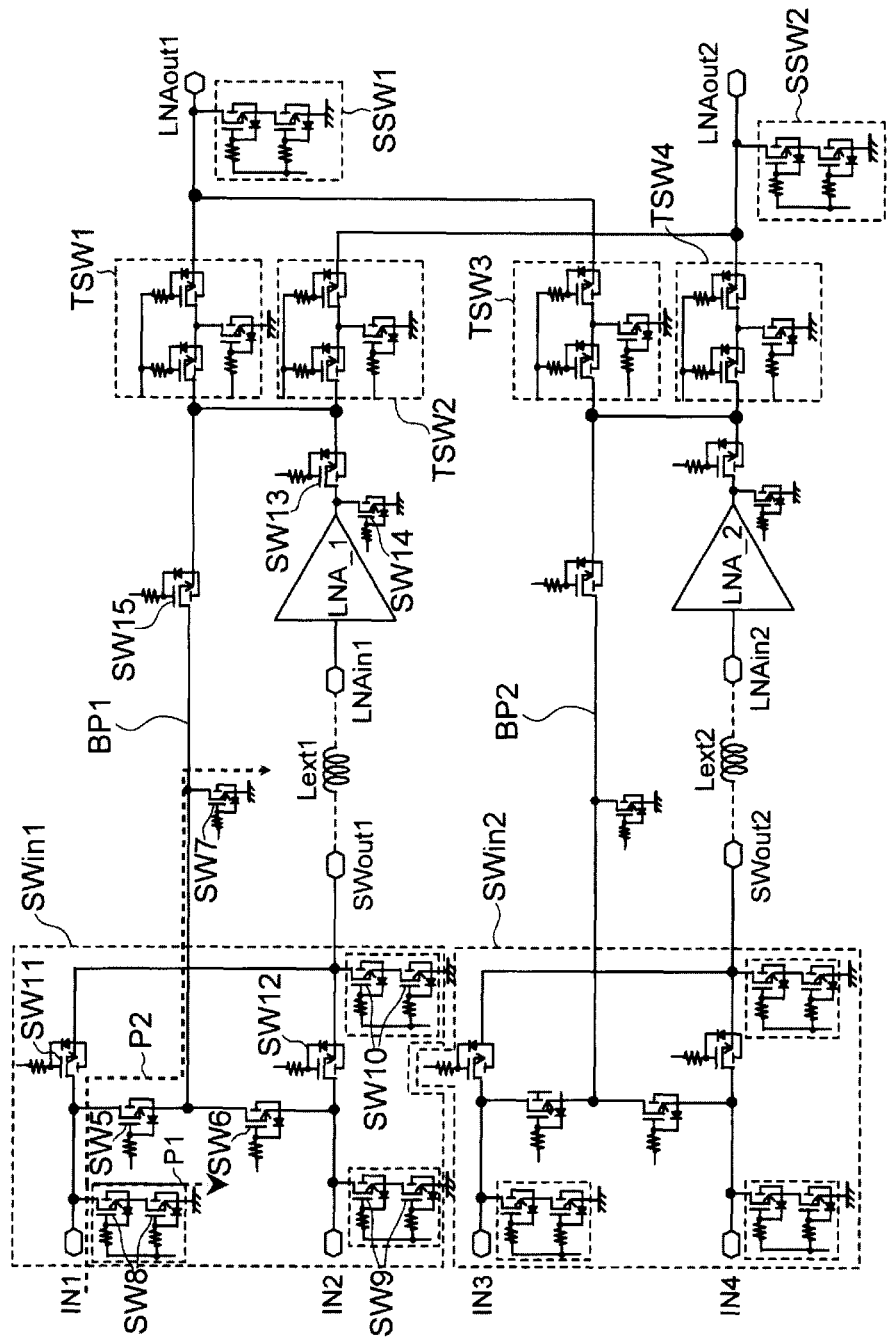
FIG. 5 is a diagram depicting a LNA according to a third embodiment.

FIG. 5 is a diagram depicting a LNA according to a third embodiment. In the third embodiment, a switch circuit is provided on the input terminal side of the device. Moreover, in the third embodiment, bypass paths BP1 and BP2, which do not pass through LNA_1 and an LNA_2, are provided. The internal configurations of the LNA_1 and the LNA_2 can be similar to the internal configuration of the LNA 1 according to the first embodiment.

The configuration between terminals IN1 and IN2 and output terminals LNAout1 and LNAout2 is similar to the configuration between terminals IN3 and IN4 and the output terminals LNAout1 and LNAout2. Therefore, the configuration corresponding to the terminals IN1 and IN2 will be explained here, and explanations of the configuration corresponding to the terminals IN3 and IN4 will be omitted.

The terminals IN1 and IN2 share the LNA_1 and the bypass path BP1. The terminals IN1 and IN2 generally receive high-frequency signals at frequencies that are close to each other. The terminals IN3 and IN4 share the LNA_2 and the bypass path BP2. Therefore, the terminals IN3 and IN4 generally receive high-frequency signals at frequencies close to each other. The terminals IN1 and IN2 and the terminals IN3 and IN4 may receive high-frequency signals at frequencies relatively away from each other.

The components depicted in FIG. 5, other than external inductor elements Lext1 and Lext2, are provided on a single SOI substrate and configured as one semiconductor chip. The external inductor elements Lext1 and Lext2 are externally attached to this semiconductor chip.

The first and second terminals IN1 and IN2 are both connected to an input terminal LNAin1 via an input switch circuit SWin1 and the external inductor element Lext1. The first and second terminals IN1 and IN2 can be arbitrarily connected to the input terminal LNAin1 or the bypass path BP1 by switching of the input switch circuit SWin1.

The bypass path BP1 is provided in parallel with the LNA_1 between the first and second terminals IN1 and IN2 and the output terminals LNAout1 and LNAout2. When the amplitude of a high-frequency signal that is input to the terminals IN1 and IN2 is large enough to eliminate the need for any amplification, the high-frequency signal can be output from the output terminal LNAout1 or LNAout2 via the bypass path BP1 (bypass mode) and thus be output without being amplified by the LNA_1. On the other hand, if the amplitude of the high-frequency signal needs to be amplified, the high-frequency signal is input to the LNA_1 (gain mode).

The input switch circuit SWin1 includes a fifth switch SW5, a sixth switch SW6, and eighth to twelfth switches SW8 to SW12.

The fifth switch SW5 is connected between the first terminal IN1 and the bypass path BP1. The fifth switch SW5 is turned on when the first terminal IN1 and the bypass path BP1 are to be connected in bypass mode.

The sixth switch SW6 is connected between the second terminal IN2 and the bypass path BP1. The sixth switch SW6 is turned on when the second terminal IN2 and the bypass path BP1 are to be connected in bypass mode.

Between the first terminal IN1 and the ground, n+1 eighth switches SW8 are connected in series. Here, n is an integer greater than or equal to 1. In the third embodiment, n=1. Therefore, two eighth switches SW8 are connected in series between the first terminal IN1 and the ground. The eighth switches SW8 are turned on when the first terminal IN1 is not used and shunt the first terminal IN1 to the ground.

Between the second terminal IN2 and the ground, n+1 ninth switches SW9 are connected in series. In the third embodiment, n=1; therefore, two ninth switches SW9 are connected in series between the second terminal IN2 and the ground. The ninth switches SW9 are turned on when the second terminal IN2 is not used and shunt the second terminal IN2 to the ground.

Between an intermediate terminal SWout1 and the ground, n+1 tenth switches SW10 are connected in series. In the third embodiment, n=1; therefore, two tenth switches SW10 are connected in series between the intermediate terminal SWout1 and the ground. The tenth switches SW10 are turned on when the LNA_1 is not in bypass mode and shunt the intermediate terminal SWout1 and the input terminal LNAin1 to the ground.

The eleventh switch SW11 is connected between the first terminal IN1 and the intermediate terminal SWout1. The eleventh switch SW11 is turned on when the first terminal IN1 and the LNA_1 are connected in gain mode.

The twelfth switch SW12 is connected between the second terminal IN2 and the intermediate terminal SWout1. The twelfth switch SW12 is turned on when the second terminal IN2 and the LNA_1 are connected in gain mode.

With such a configuration, the input switch circuit SWin1 can connect either of the first and second terminals IN1 and IN2 to the bypass path BP1 or the intermediate terminal SWOUT1 (LNA_1). An operation of the input switch circuit SWin1 will be described later with reference to FIGS. 6 and 7.

The seventh switch SW7 and a fifteenth switch SW15 are provided on the bypass path BP1. The seventh switch SW7 is connected between the bypass path BP1 and the ground. The seventh switch SW7 is turned on when the bypass path BP1 is being shunted to the ground in gain mode. The seventh switch SW7 may be n (where n≥1) switches connected in series.

The fifteenth switch SW15 is provided on the bypass path BP1 and connected between the fifth and sixth switches SW5 and SW6 and through-switch circuits TSW1 and TSW2. The fifteenth switch SW15 is turned on when either of the terminals IN1 or IN2 is connected to the output terminal LNAout1 or LNAout2 in bypass mode.

A thirteenth switch SW13 and a fourteenth switch SW14 are provided at point on the path between an output of the LNA_1 and the through-switch circuits TSW1 and TSW2. The thirteenth switch SW13 is connected between the LNA_1 and the through-switch circuits TSW1 and TSW2. The thirteenth switch SW13 is turned on when the LNA_1 is being connected to the output terminal LNAout1 or LNAout2 in gain mode.

The fourteenth switch SW14 connects or disconnects between the output of the LNA_1 and the ground. The fourteenth switch SW14 is turned on when the output of the LNA_1 is shunted to the ground in bypass mode.

The through-switch circuit TSW1 is connected on one side to the output terminal LNAout1 and on the other side to the bypass path BP1 and the LNA_1. The through-switch circuit TSW2 is connected on one side to the output terminal LNAout2 and on the other side to the bypass path BP1 and the LNA_1. The through-switch circuit TSW1 can connect the output terminal LNAout1 to the bypass path BP1 or the LNA_1. The through-switch circuit TSW2 can connect the output terminal LNAout2 to the bypass path BP1 or the LNA_1. The internal configurations of the through-switch circuits TSW1 and TSW2 may be similar to the internal configuration of the through-switch circuit TSW11 of the second embodiment.

A shunt switch circuit SSW1 is connected between the output terminal LNAout1 and the ground. The shunt switch circuit SSW1 is in an on state when the output terminal LNAout1 is not being used. A shunt switch circuit SSW2 is connected between the output terminal LNAout2 and the ground. The shunt switch circuit SSW2 is in an on state when the output terminal LNAout2 is not being used. The internal configurations of the shunt switch circuits SSW1 and SSW2 may be similar to the internal configuration of the shunt switch circuit SSW1 of the second embodiment.

The intermediate terminal SWout1 is provided between the input terminal LNAin1 on one side and the terminals IN1 and IN2 on the other side. The intermediate terminal SWout1 is connectable to the input terminal LNAin1 via the external inductor element Lext1. As a result of the external inductor element Lext1 being connected, the terminals IN1 and IN2 are each connectable to the LNA_1 via the external inductor element Lext1.

Here, the number of the eighth switches SW8 is a number n+1, which is greater than the number n of the seventh switches SW7 by one. This is to make the total number of the switches SW8 and the total number of the switches SW5 and SW7 connected in parallel from the terminal IN1 to the ground equal to each other. For instance, there are a total of two switches SW8 connected in series between the terminal IN1 and the ground. Likewise, there are a total of two switches SW5 and SW7 connected in series between the terminal IN1 and the ground. Therefore, the number of the eighth switches SW8 is a number n+1 obtained by adding one to the number n of the seventh switches SW7. The addition of one accounts for the number of the fifth switches SW5 connected in series with the total of n seventh switches SW7. As a result, the same number of switches (SW8, SW8) and switches (SW5, SW7) are connected in parallel with each other between the first terminal IN1 and the ground.

Moreover, the fifth to ninth switches SW5 to SW9 are MOSFETs having characteristics (such as a threshold voltage, a gate length, the thickness of a gate insulating film, and so forth) excepting for a gate width that can be substantially identical to each other so as to bring the two switches SW5 and SW7 and the two switches SW8 into conduction at almost the same time when a high voltage by the ESD is applied to the terminal IN1.

As described above, by making the number and characteristics of the switches SW5 and SW7 in one conductance path from the terminal IN1 to the ground equal to the number and characteristics of the switches SW8 in another conductance path from the terminal IN1 to the ground, the switches SW5 and SW7 and the switches SW8 will also function as an ESD protective circuit.

For instance, if a high voltage caused by an ESD is applied to the first terminal IN1 when the switches SW5 to SW15 are in an off state, the two switches SW5 and SW7 and the two switches SW8 will be brought into conduction at the same time.

As a result, as indicated by dashed arrows in FIG. 5, a current caused by the ESD flows into the ground via a path P1 passing through the two switches SW8 and also a path P2 passing through the two switches SW5 and SW7. As described above, a current caused by the ESD flows through the path P1 and the path P2, which is connected in parallel with the path P1 to the ground. As a result, the gate width of a switch that functions as an ESD protective element can be substantially increased, which permits a current caused by an ESD event to flow more easily to the ground.

As described above, as a result of the two total switches SW5 and SW7 and the two switches SW8 functioning as an ESD protective element, ESD tolerance can be increased without separately providing an ESD protective element as discrete component.

When a high voltage caused by an ESD is applied to the terminal IN2, the two switches SW6 and SW7 and the two ninth switches SW9, which are present between the terminal IN2 and the ground, are brought into conduction at the same time. As a result, ESD tolerance at the terminal IN2 can be also increased without separately providing an ESD protective element.

Moreover, when a high voltage caused by the ESD is applied to the intermediate terminal SWout1, the two tenth switches SW10 present between the intermediate terminal SWout1 and the ground are brought into conduction. As a result, ESD tolerance at the intermediate terminal SWout1 also can be increased without separately providing an ESD protective element.

Next, operations in gain mode and bypass mode will be described.

Figure 6:
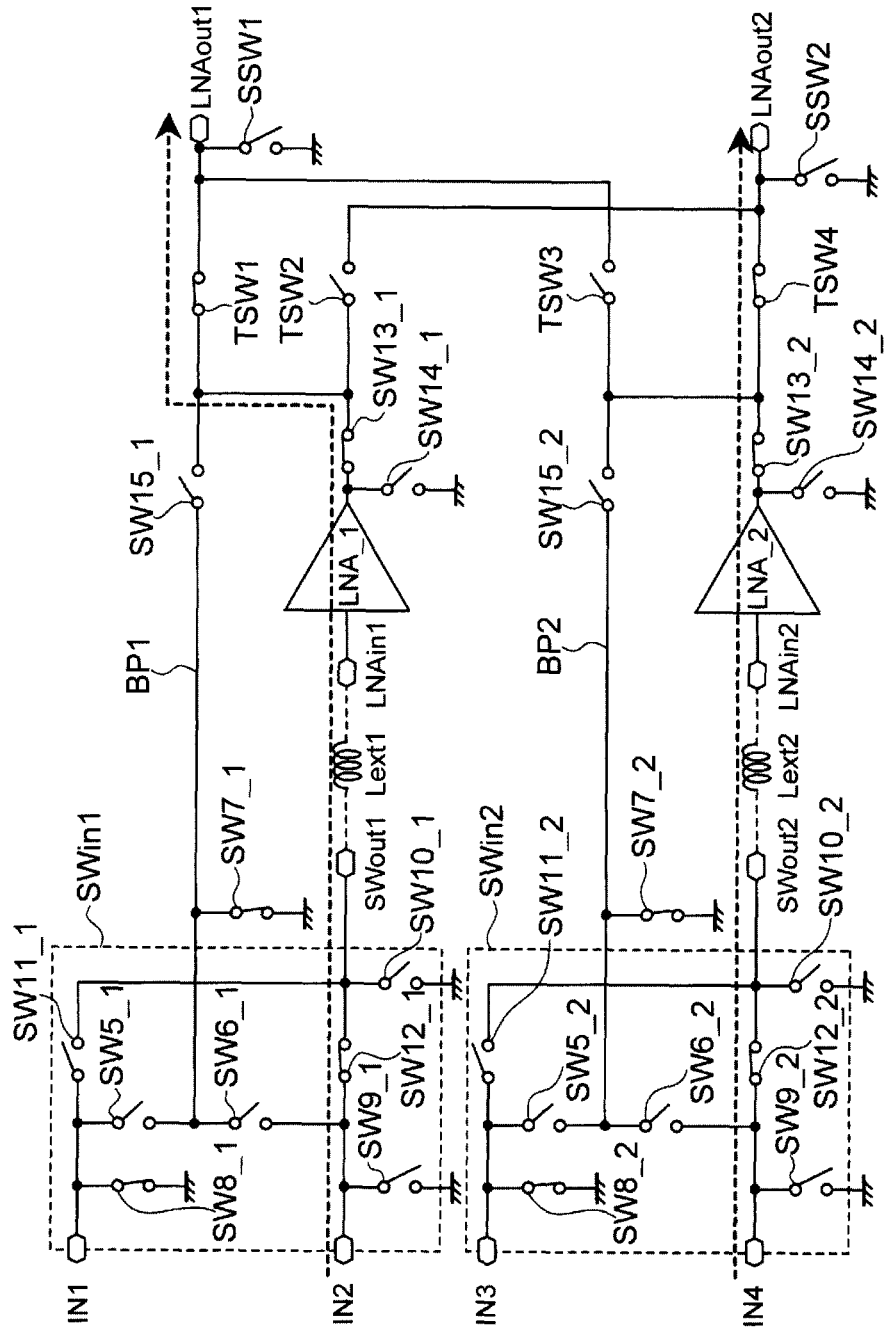
FIG. 6 is a diagram depicting an operation of a LNA in gain mode.
Figure 7:
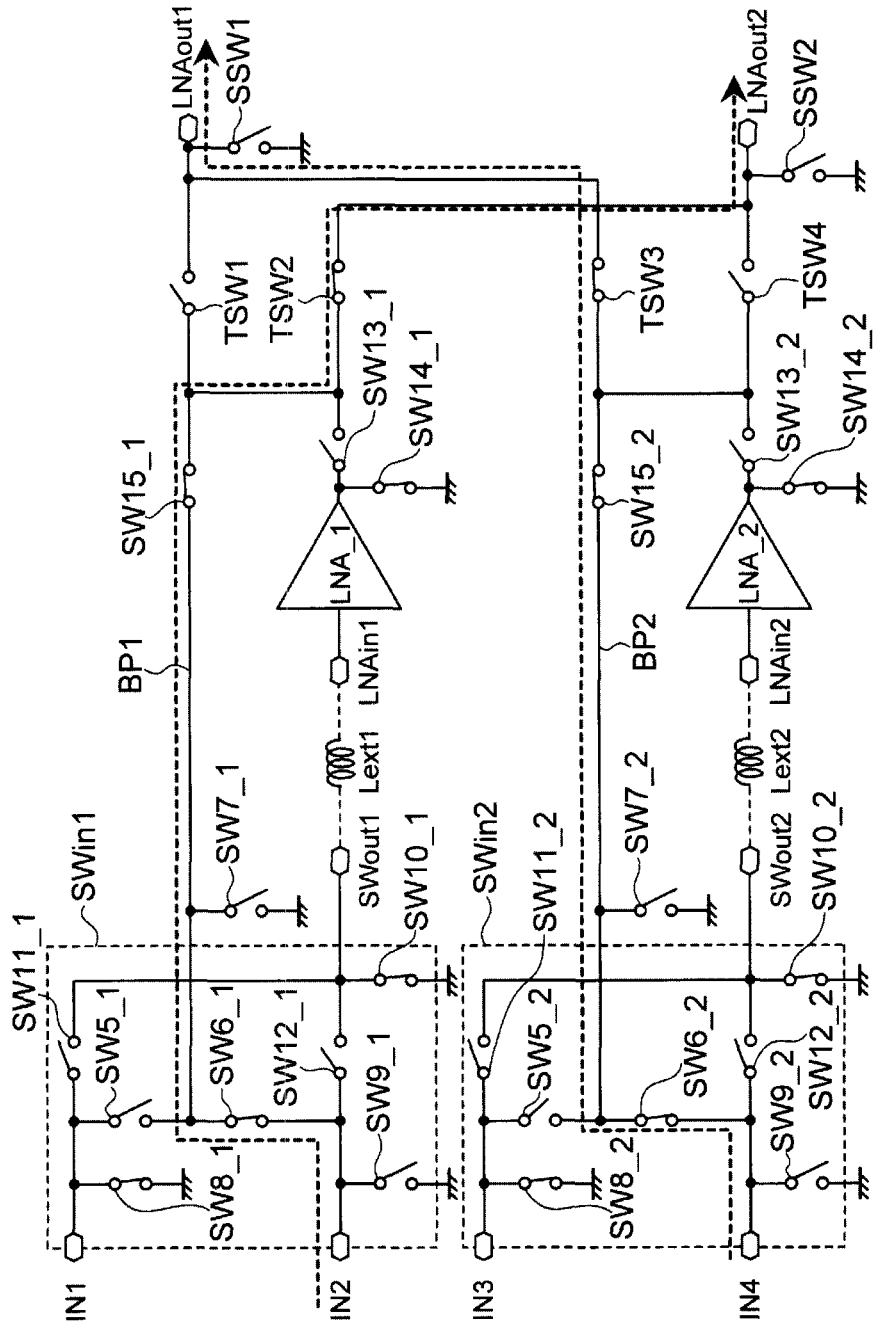
FIG. 7 is a diagram depicting an operation of a LNA in bypass mode.

FIG. 6 is a diagram depicting an operation of the LNA in gain mode. FIG. 7 is a diagram depicting an operation of the LNA in bypass mode. In FIGS. 6 and 7, the switches SW5 to SW15, TSW1 to TSW4, and SSW1 and SSW2 are depicted in a simplified manner. Hereinafter, to differentiate between those switches SW5 to SW15 corresponding to the terminals IN1 and IN2 and those switches SW5 to SW15 corresponding to the terminals IN3 and IN4, the switches corresponding to the terminals IN1 and IN2 are denoted as SW5_1 to SW15_1 and the switches corresponding to the terminals IN3 and IN4 are denoted as SW5_2 to SW15_2.

(Gain Mode)

In FIG. 6, a high-frequency signal input to the terminal IN2 is amplified by the LNA_1 and then output from the output terminal LNAout1. Also, a high-frequency signal input to the terminal IN4 is amplified by the LNA_2 and output from the output terminal LNAout2.

To input the high-frequency signal from the terminal IN2 to the LNA_1 and transfer the amplified high-frequency signal to the output terminal LNAout1, the switches SW12_1, SW13_1, and TSW1 are turned on. To provide isolation between the terminal IN2 or the output terminal LNAout1 and the ground, the switches SW9_1, SW10_1, SW14_1, and SSW1 are turned off. Moreover, to prevent the high-frequency signal from entering the terminal IN1, the output terminal LNAout2, and the bypass path BP1, the switches SW5_1, SW6_1, SW11_1, SW15_1, and TSW2 are turned off and the switches SW7_1 and SW8_1 are turned on.

To input the high-frequency signal from the terminal IN4 to the LNA_2 and transfer the amplified high-frequency signal to the output terminal LNAout2, the switches SW12_2, SW13_2, and TSW4 are turned on. To provide isolation between the terminal IN4 or the output terminal LNAout2 and the ground, the switches SW9_2, SW10_2, SW14_2, and SSW2 are turned off. Moreover, to prevent the high-frequency signal from entering the terminal IN3, the output terminal LNAout1, and the bypass path BP2, the switches SW5_2, SW6_2, SW11_2, SW15_2, and TSW3 are turned off and the switches SW7_2 and SW8_2 are turned on.

As described above, in gain mode, a high-frequency signal input to the terminal IN2 can be amplified by the LNA_1 and output from the output terminal LNAout1. Moreover, a high-frequency signal input to the terminal IN4 can be amplified by the LNA_2 and output from the output terminal LNAout2.

Though not depicted in the drawing, by manipulating the above-described switches, a high-frequency signal input to the terminal IN2 can also be amplified by the LNA_1 and output from the output terminal LNAout2. Similarly, a high-frequency signal input to the terminal IN4 can also be amplified by the LNA_2 and output from the output terminal LNAout1.

Furthermore, by manipulating the above-described switches, a high-frequency signal input to the terminal IN1 can also be amplified by the LNA_1 and output from the output terminal LNAout1 or LNAout2. A high-frequency signal input to the terminal IN3 can also be amplified by the LNA_2 and output from the output terminal LNAout1 or LNAout2.

(Bypass Mode)

In FIG. 7, a high-frequency signal input to the terminal IN2 is output from the output terminal LNAout2 via the bypass path BP1. Also, a high-frequency signal input to the terminal IN4 is output from the output terminal LNAout1 via the bypass path BP2.

To transfer a high-frequency signal from the terminal IN2 to the output terminal LNAout2 via the bypass path BP1, the switches SW6_1, SW15_1, and TSW2 are turned on. To provide isolation between the terminal IN2 or the bypass path BP1 and the ground, the switches SW9_1, SW7_1, and SSW2 are turned off. Moreover, to prevent the high-frequency signal from entering the terminal IN1, the output terminal LNAout1, and the LNA_1, the switches SW5_1, SW11_1, SW12_1, SW13_1, and TSW1 are turned off and the switches SW8_1, SW10_1, and SW14_1 are turned on.

To transfer a high-frequency signal from the terminal IN4 to the output terminal LNAout1 via the bypass path BP2, the switches SW6_2, SW15_2, and TSW3 are turned on. To provide isolation between the terminal IN4 or the bypass path BP2 and the ground, the switches SW9_2, SW7_2, and SSW1 are turned off. Moreover, to prevent the high-frequency signal from entering the terminal IN3, the output terminal LNAout2, and the LNA_2, the switches SW5_2, SW11_2, SW12_2, SW13_2, and TSW4 are turned off and the switches SW8_2, SW10_2, and SW14_2 are turned on.

As described above, in bypass mode, a high-frequency signal input to the terminal IN2 can be output from the output terminal LNAout2 via the bypass path BP1 without being amplified. Moreover, a high-frequency signal input to the terminal IN4 can be output from the output terminal LNAout2 via the bypass path BP2 without being amplified.

Though not depicted in the drawing, by manipulating the above-described switches, a high-frequency signal input to the terminal IN2 can also be output from the output terminal LNAout1 via the bypass path BP1. Similarly, a high-frequency signal input to the terminal IN4 can also be output from the output terminal LNAout2 via the bypass path BP2.

Furthermore, by manipulating the above-described switches, a high-frequency signal input to the terminal IN1 can also be output from the output terminal LNAout1 or LNAout2 via the bypass path BP1. A high-frequency signal input to the terminal IN3 can also be output from the output terminal LNAout1 or LNAout2 via the bypass path BP2.

As described above, in a LNA according to the third embodiment, the input switch circuits SWin1 and SWin2 and the switch SW7 double in function as an ESD protective element. Therefore, ESD tolerance can be increased without separately providing an ESD protective element as a discrete component. The third embodiment can also obtain the beneficial effects noted for the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device on a silicon-on-insulator substrate, comprising:
   an input node to receive a first signal;
   an output node to output a second signal corresponding to the first signal;
   a first transistor having a gate that receives the first signal from the input node and thereby outputs an amplified first signal;
   a second transistor connected between a drain of the first transistor and the output node;
   a first inductor connected between a source of the first transistor and a ground potential node;
   a first capacitor connected between the gate of the first transistor and the input node; and
   an electrostatic discharge (ESD) protective element connected between a first node and a second node, the first node being between the first inductor and the first transistor, the second node being between the input node and the first capacitor, wherein the ESD protective element includes:
   a plurality of first diodes connected in series between the first node and the second node in a forward direction from the first node to the second node; and
   a plurality of second diodes connected in series between the first node and the second node in a reverse direction from the first node to the second node, and
   the plurality of first diodes is connected in parallel with the plurality of second diodes between the first and second nodes.

2. The semiconductor device according to claim 1, further comprising:
   a bias circuit configured to generate internal voltages from an external voltage supplied to the bias circuit;
   a second capacitor connected between the output node and a drain of the second transistor;
   a second inductor connected between a first output of the bias circuit and the drain of the second transistor;
   a first resistance element connected in parallel with the second inductor element between the first output of bias circuit and the drain of the second transistor;
   a second resistance element connected between the gate of the first transistor and a second output of the bias circuit; and
   a third resistance element connected between a gate of the second transistor and a third output of the bias circuit.

3. The semiconductor device according to claim 1, further comprising:
   a first output terminal connectable to the output node;
   a second output terminal connectable to the output node;
   a first switch between the first output terminal and the output node;
   a second switch connected in series with the first switch between the first output terminal and the output node;
   at least one third switch connected between the ground potential node and a third node between the first switch and the second switch; and
   a plurality of fourth switches connected in series between the ground potential node and a fourth node between the first output terminal and the second switch, wherein
   the second switch is between the third and fourth node,
   m is equal to the number of third switches connected in series between the ground potential node and the third node, and
   the number of fourth switches in the plurality of fourth switches is equal to m+1.

4. The semiconductor device according to claim 1, further comprising:
   a first output terminal connectable to the output node;
   a second output terminal connectable to the output node;
   a first through-switch connected between the output node and the first output terminal;
   a second through-switch connected between the output node and the second output terminal;
   a first shunt-switch connected between the ground potential node and a first shunt node between the first through-switch and the first output terminal; and
   a second shunt-switch connected between the ground potential node and a second shunt node between the second through-switch and the second output terminal, wherein
   the first and second through-switches each include:
   a first switch between the output node and a respective one of the first and second output terminals;
   a second switch connected in series with the first switch between the output node and the respective one of the first and second output terminals; and
   at least one third switch connected between the ground potential node and a third node between the first switch and the second switch, and
   the first and second shunt switches each include:
   a plurality of fourth switches connected in series between the ground potential node and a respective one of the first and second shunt nodes, and
   m is equal to the number of third switches connected in series in one of the first and second through-switches, and the number of fourth switches in the plurality of fourth switches in the corresponding first or second shunt switch connected to the one of the first and second through-switches is equal to m+1.

5. The semiconductor device according to claim 4, further comprising:

an input switch circuit having an input switch output terminal connected to the input node via an inductor element.

6. The semiconductor device according to claim 1, further comprising:
an input switch circuit having an input switch output terminal connected to the input node via an inductor element, the input switch circuit including:
a first input terminal and a second input terminal;
a first shunt switch connected between the first input terminal and the ground potential node; and
a second shunt switch connected between the second input terminal and the ground potential node.

7. A semiconductor device, comprising:
an input switch circuit group connected to a plurality of input terminals;
a through-switch circuit group connected to a plurality of output terminals; and
a plurality of low-noise amplifiers connected between the input switch circuit group and the through-switch circuit group, each low-noise amplifier having:
an input node to receive a first signal;
an output node to output a second signal corresponding to the first signal;
a first transistor having a gate that receives the first signal from the input node and thereby outputs an amplified first signal;
a second transistor connected between a drain of the first transistor and the output node;
a first inductor connected between a source of the first transistor and a ground potential node;
a first capacitor connected between the gate of the first transistor and the input node; and
an electrostatic discharge (ESD) protective element connected between a first node and a second node, the first node being between the first inductor and the first transistor, the second node being between the input node and the first capacitor, wherein
the input node of each low-noise amplifier is connectable to at least two input terminals via the input switch circuit group,
the output node of each low-noise amplifier is connectable to at least two output terminal via the through-switch circuit group, and
a bypass path is provided from the input switch circuit group to the through-switch circuit group, the bypass path not pass through any low-noise amplifier.

8. The semiconductor device according to claim 7, wherein
the ESD protective element in at least one low-noise amplifier includes:
a plurality of first diodes connected in series between the first node and the second node in a forward direction from the first node to the second node; and
a plurality of second diodes connected in series between the first node and the second node in a reverse direction from the first node to the second node, and
the plurality of first diodes is connected in parallel with the plurality of second diodes between the first and second nodes.

9. The semiconductor device according to claim 7, wherein at least one low-noise amplifier further includes:
a bias circuit configured to generate internal voltages from an external voltage supplied to the bias circuit;
a second capacitor connected between the output node and a drain of the second transistor;
a second inductor connected between a first output of the bias circuit and the drain of the second transistor;
a first resistance element connected in parallel with the second inductor element between the first output of bias circuit and the drain of the second transistor;
a second resistance element connected between the gate of the first transistor and a second output of the bias circuit; and
a third resistance element connected between a gate of the second transistor and a third output of the bias circuit.

10. The semiconductor device according to claim 7, wherein
the through-switch circuit group includes:
a first output terminal connectable to output nodes of at least two low-noise amplifiers;
a second output terminal connectable to the output nodes of the at least two low-noise amplifiers;
a first switch between the first output terminal and the output node of a first low-noise amplifier of the at least two low-noise amplifiers;
a second switch connected in series with the first switch between the first output terminal and the output node of the first low-noise amplifier;
at least one third switch connected between the ground potential node and a third node between the first switch and the second switch; and
a plurality of fourth switches connected in series between the ground potential node and a fourth node between the first output terminal and the second switch, the second switch being between the third and fourth node,
m is equal to a total number of third switches connected in series between the ground potential node and the third node, and
the number of fourth switches in the plurality of fourth switches is equal to m+1.

11. The semiconductor device according to claim 7, wherein
the through-switch circuit group includes:
a first output terminal connectable to output nodes of at least two low-noise amplifiers;
a second output terminal connectable to the output nodes of the at least two low-noise amplifiers;
a first through-switch connected between the first output terminal and an output node of a first low-noise amplifier of the at least two low-noise amplifiers;
a second through-switch connected between the second the output terminal of the first low-noise amplifier of the at least two low-noise amplifiers;
a first shunt-switch connected between the ground potential node and a first shunt node between the first through-switch and the first output terminal; and
a second shunt-switch connected between the ground potential node and a second shunt node between the second through-switch and the second output terminal, wherein
the first and second through-switches each include:
a first switch between the output node of the first low-noise amplifier of the at least two low-noise amplifiers and a respective one of the first and second output terminals;
a second switch connected in series with the first switch between the output node of the first low-noise amplifier of the at least two low-noise amplifiers and the respective one of the first and second output terminals; and at least one third switch connected between the ground potential node and a third node between the first switch and the second switch, and the first and second shunt switches each include a plurality of fourth switches connected in series between the ground potential node and a respective one of the first and second shunt nodes, and when m is equal to a number of third switches connected in series in either one of the first and second through-switches, the number of fourth switches in the plurality of fourth switches in the corresponding first or second shunt switch connected to the one of the first and second through-switches is equal to m+1.

12. The semiconductor device according to claim 7, wherein the plurality input terminal includes first to p-th (p≥3) input terminals, the plurality of output terminal includes first to q-th (q<p) output terminals, the plurality of low-noise amplifiers include one low-noise amplifier for each of the first to p-th input terminals, the through-switch circuit group includes a through-switch between each low-noise amplification circuit and each of the first to q-th output terminals, and a shunt switch circuit is provided for each of the first to q-th output terminals.

13. The semiconductor device according to claim 7, further comprising:

a fifth switch connected between the bypass path and a first input terminal in the plurality of input terminals;

a sixth switch connected between the bypass path and a second input terminal in the plurality of input terminals;

at least one seventh switch connected between the bypass path and the ground potential node;

a plurality of eighth switches connected in series between the first input terminal and the ground potential node; and a plurality of ninth switches connected in series between the second input terminal and the ground potential node, wherein n is equal to a total number of seventh switches connected in series between the bypass path and the ground potential node, the number of eighth switches in the plurality of eight switches is equal to n+1, and the number of ninth switches in the plurality of ninth switches is equal to n+1.

14. The semiconductor device according to claim 13, further comprising:

an intermediate terminal between the input node of at least one low-noise amplifier and the input switch group, the intermediate terminal being connected to the input node of the at least one low-noise amplifier via an inductor element; and a plurality of tenth switches connected in series between the intermediate terminal and the ground potential node, wherein the number of tenth switches in the plurality of ninth switches being equal to n+1.

15. A low-noise amplifier device on a silicon-on-insulator substrate, comprising:

an input node to receive a first signal;

an output node to output a second signal corresponding to the first signal;

a first transistor having a gate that receives the first signal from the input node and thereby outputs an amplified first signal;

a second transistor connected between a drain of the first transistor and the output node;

a first inductor connected between a source of the first transistor and a ground potential node;

a first capacitor connected between the gate of the first transistor and the input node;

a plurality of first diodes connected in series between a first node and a second node in a forward direction from the first node to the second node, the first node being between the first inductor and the first transistor, the second node being between the input node and the first capacitor; and a plurality of second diodes connected in series between the first node and the second node in a reverse direction from the first node to the second node, wherein the plurality of first diodes is connected in parallel with the plurality of second diodes between the first and second nodes.

16. The low-noise amplifier device according to claim 15, further comprising:

a bias circuit configured to generate internal voltages from an external voltage supplied to the bias circuit;

a second capacitor connected between the output node and a drain of the second transistor;

a second inductor connected between a first output of the bias circuit and the drain of the second transistor;

a first resistance element connected in parallel with the second inductor element between the first output of bias circuit and the drain of the second transistor;

a second resistance element connected between the gate of the first transistor and a second output of the bias circuit; and a third resistance element connected between a gate of the second transistor and a third output of the bias circuit.

17. The low-noise amplifier device according to claim 15, further comprising:

a first output terminal connectable to the output node;

a second output terminal connectable to the output node;

a first switch between the first output terminal and the output node;

a second switch connected in series with the first switch between the first output terminal and the output node;

at least one third switch connected between the ground potential node and a third node between the first switch and the second switch; and a plurality of fourth switches connected in series between the ground potential node and a fourth node between the first output terminal and the second switch, the second switch being between the third and fourth node, wherein m is equal to the number of third switches connected in series between the ground potential node and the third node, and the number of fourth switches in the plurality of fourth switches is equal to m+1.

18. The low-noise amplifier device according to claim 15, further comprising:

a first output terminal connectable to the output node;

a second output terminal connectable to the output node;

a first through-switch connected between the output node and the first output terminal;

a second through-switch connected between the output node and the second output terminal;

a first shunt-switch connected between the ground potential node and a first shunt node between the first through-switch and the first output terminal; and a second shunt-switch connected between the ground potential node and a second shunt node between the second through-switch and the second output terminal, wherein the first and second through-switches each include:
  a first switch between the output node and a respective one of the first and second output terminals;
  a second switch connected in series with the first switch between the output node and the respective one of the first and second output terminals; and
  at least one third switch connected between the ground potential node and a third node between the first switch and the second switch, and the first and second shunt switches each include a plurality of fourth switches connected in series between the ground potential node and a respective one of the first and second shunt nodes, and when m is equal to the number of third switches connected in series in one of the first and second through-switches, and the number of fourth switches in the plurality of fourth switches in the corresponding first or second shunt switch connected to the one of the first and second through-switches is equal to m+1.

19. The low-noise amplifier device according to claim 15, further comprising:

an input switch circuit having an input switch output terminal connected to the input node via an inductor element, the input switch circuit including:
  a first input terminal and a second input terminal;
  a first shunt switch connected between the first input terminal and the ground potential node; and
  a second shunt switch connected between the second input terminal and the ground potential node.

* * * * *